United States Patent
O'Keefe et al.

[11] Patent Number: 5,877,037
[45] Date of Patent: Mar. 2, 1999

[54] PROCESS FOR REDUCING BOND RESISTANCE IN SEMICONDUCTOR DEVICES AND CIRCUITS

[75] Inventors: Matthew F. O'Keefe, Chelmsford; Joel L. Goodrich, Westford; Donald Cordeiro, Woburn, all of Mass.; Nitin Jain, Nashua, N.H.

[73] Assignee: The Whitaker Corporation, Wilmington, Del.

[21] Appl. No.: 640,290

[22] Filed: Jul. 22, 1996

[51] Int. Cl.$^6$ ........................................................ H01L 21/00
[52] U.S. Cl. ................................................ 438/39; 438/602
[58] Field of Search ..................................... 438/26, 39, 40, 438/96, 602, 603, 664, 605, 606, 612

[56] References Cited

U.S. PATENT DOCUMENTS

| | | |
|---|---|---|
| 3,387,189 | 6/1968 | Anderson et al. . |
| 4,075,650 | 2/1978 | Calviello . |
| 4,616,404 | 10/1986 | Wang et al. . |
| 5,145,809 | 9/1992 | Walker ........................................ 438/121 |
| 5,268,310 | 12/1993 | Goodrich et al. . |
| 5,343,070 | 8/1994 | Goodrich et al. . |
| 5,366,589 | 11/1994 | Chang ......................................... 438/612 |

OTHER PUBLICATIONS

Self–Aligned Cobalt Disilicide for Gate and Interconnection and Contacts to Shallow Junctions; 9 pages, Murarka et al., Oct. 1987.

Refractory Silicides for Integrated Circuits; 18 pages Murarka Jul. 8, 1980.

HMIC—A Fully Capable Silicon Microwave Integrated Circuit Process; 9 pages, Goodrich et al. Sep. 1993.

Titanium Silicide Formation On Heavily Doped Arsenic–Implanted Silicon; 9 pages, Dowben et al., 1985.

Titanium Silicidation By Halogen Lamp Annealling; 5 pages, Okamoto et al. Jun. 1985.

Metastable Phase Formation In Titanium–Silicon Thin Films; 6 pages, Beyers, Jun. 1985.

PIN Diode Switches On Glass Substrate Ics; 9 pages, Howell et al. 1990.

*Primary Examiner*—Kevin M. Picardat

[57] ABSTRACT

It has been identified that a known loss mechanism in the access path to a mesa type device is more significant than previously believed. The source of the loss is due to the electromagnetic interaction of the wire bond and the device side wall which induces an image current at the side wall along the path of the wire bond. According to the teachings of the present invention, a process for forming a conductive coating on a semiconductor device is disclosed. The coating reduces high frequency losses associated with the device. The processes disclosed are compatible with existing semiconductor fabrication devices and advantageously provide improved uniformity and repeatability.

16 Claims, 5 Drawing Sheets

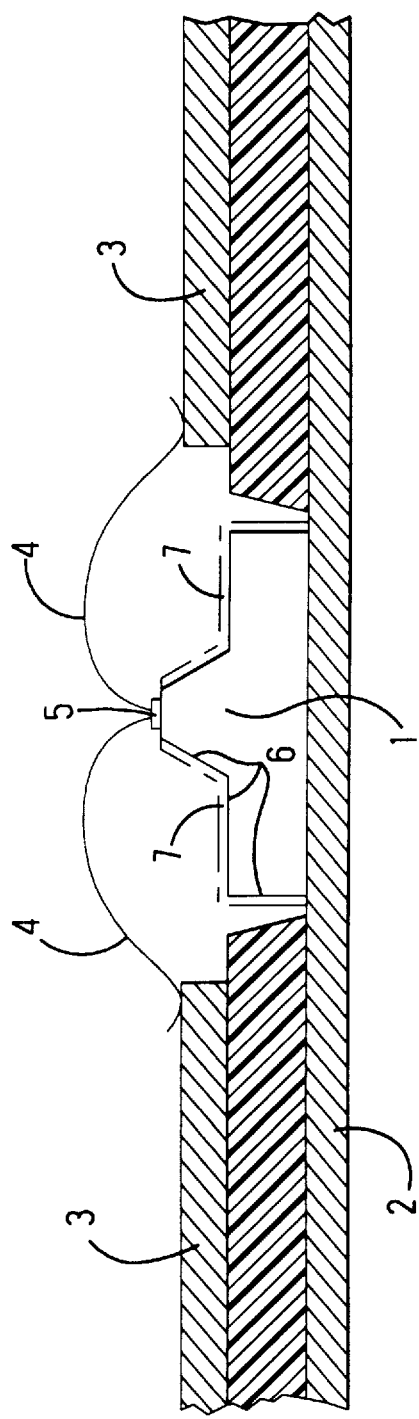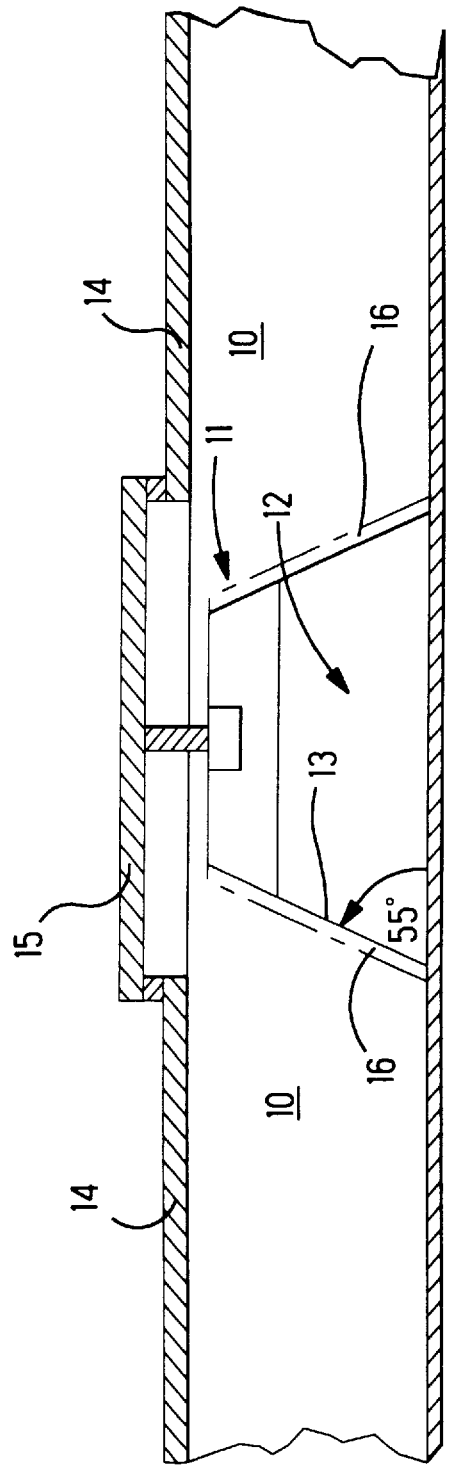

PROCESS FOR REDUCING BOND RESISTANCE IN SEMICONDUCTOR DEVICES AND CIRCUITS

FIELD OF THE INVENTION

The present invention relates to a process for fabrication of semiconductor devices and circuits and more particularly to a fabrication process to reduce the effective interconnect resistance in discrete and monolithic semiconductor electronic devices and circuits.

BACKGROUND OF THE INVENTION

Monolithic and discrete microwave semiconductor devices are used for example to manufacture switches for microwave and millimeter wave applications. These switches may include PIN diodes as the active element. A PIN diode may be manufactured using the process taught in U.S. Pat. No. 5,268,310 owned by the assignee of the present invention, the disclosure of which is hereby specifically incorporated by reference. Electrical connection from a transmission line to the diode may be made through a wire bond that spans the mesa side wall of the PIN diode and electrically contacts the diode terminal. It is known that a diode connected in this way exhibits a resistive loss in the area of the access to the diode. It is also known that the loss at the bond is frequency related. Prior solutions to the lossy bond problem have been to increase the doping in the PIN mesa side wall. The increased doping reduces parasitic resistance and confines the carriers away from the side wall surface. Devices having the increased doping on the side walls, however, still exhibit significant loss. The exhibited loss also varies for devices in a single wafer, causing nonuniformity, as well as for devices on one wafer to the next, causing nonrepeatability. Variations in the operating parameters of semiconductor devices are detrimental to the effective use and application of these devices. Variations in predicted performance of the devices limit the design parameters for their application in that a circuit design must account for the expected variations in the performance parameters. It may or may not be possible to design the necessary tolerances into a circuit. If it is not possible for a product design to tolerate the expected variations in device or circuit performance, the product may not work that use those devices or circuits at the outer ends of the performance range.

There is a need, therefore, to reduce the loss associated with a discrete or monolithic semiconductor device in the area of the access to the device. There is a further need to improve the uniformity and repeatability of discrete and monolithic devices.

There is a further need, therefore, to have a process for fabricating a device or circuit having reduced loss that is compatible with existing fabrication processes. The process also preferably improves uniformity and repeatability of the fabricated devices or circuits.

SUMMARY

It is an object of the present invention to reduce the loss associated with a discrete or monolithic semiconductor device or circuit.

It is a further object of the present invention to improve the repeatability and uniformity of discrete and monolithic devices or circuits.

It is a further object of the present invention to form a relatively thick film of metal or silicide while maintaining a resistivity substantially equivalent to the thin film resistivity.

A process according to the teachings of the present invention comprises the steps of fabricating a device or circuit on a substrate and forming a coating along a path of an induced current. The skin effect sheet resistivity of the coating is less than the skin effect sheet resistivity of the fabricated device material beneath the coating.

It is a feature of the present invention that a coating is disposed on a discrete or monolithic semiconductor device along a path of induced current.

It is a further feature of the present invention that the coating comprises a material wherein skin effect sheet resistivity is less than the skin effect sheet resistivity of the device material beneath the coating.

It is an advantage of the present invention that the loss of the device is reduced as compared to prior devices.

It is an advantage of the present invention that a process to reduce losses associated with the device or circuit are compatible with existing fabrication processes.

It is an advantage of the present invention that devices exhibit improved uniformity and repeatability.

It is an advantage of the present invention that the noise figure is lower than that for prior devices.

BRIEF DESCRIPTION OF THE DRAWINGS

Embodiments of the invention will now be described by way of example with reference to the accompanying drawings in which:

FIG. 1 is a representation of a cross sectional view of a discrete diode according to the teachings of the present invention.

FIG. 2 is a representation of a cross sectional view of a Heterolithic Microwave Integrated Circuit (HMIC) diode according to the teachings of the present invention.

DETAILED DESCRIPTION OF THE PREFERRED EMBODIMENT

Figure 3:
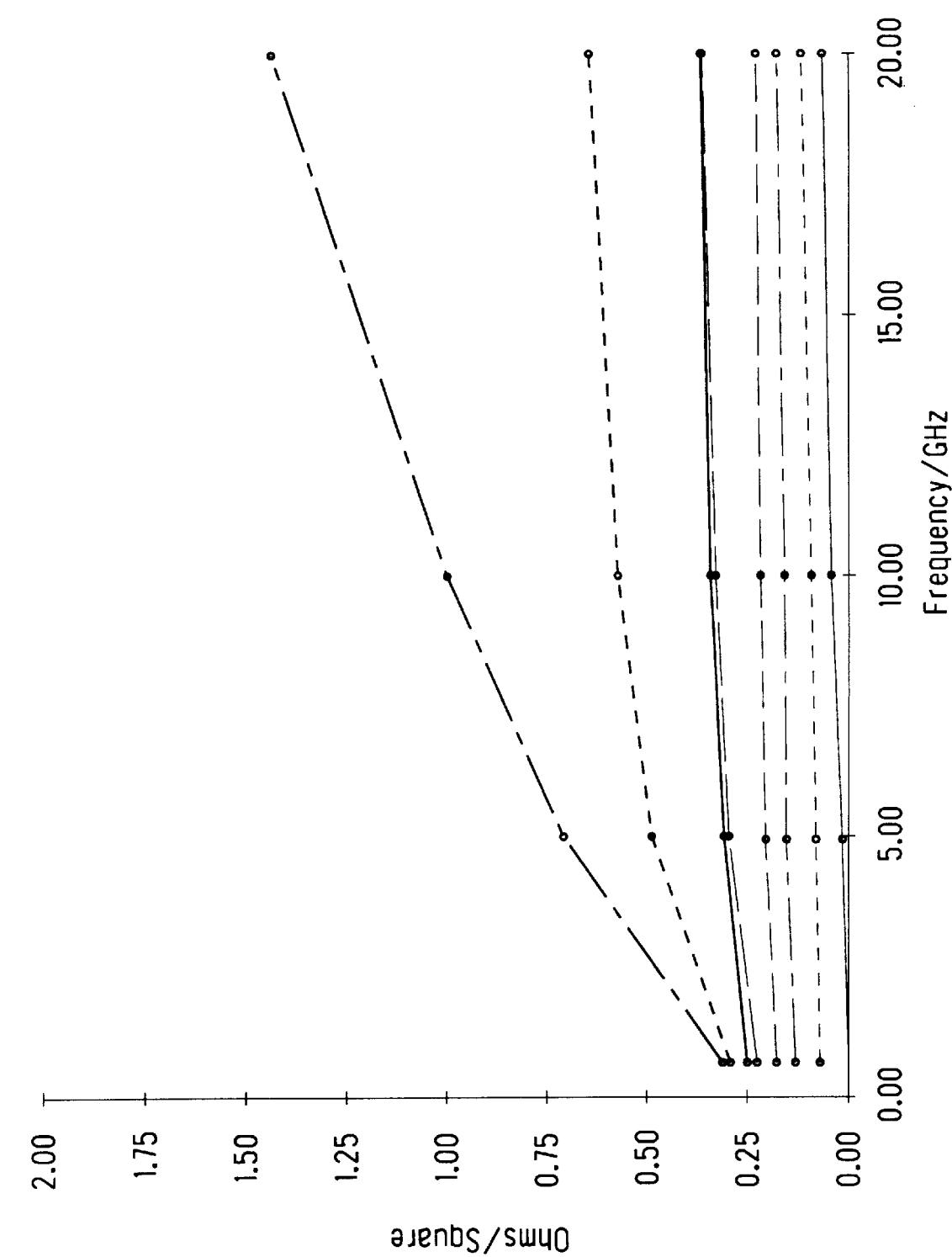
FIG. 3 is a graphical representation showing the sheet resistance versus frequency for various coatings on conductive silicon.

With specific reference to FIG. 1 of the drawings, there is shown a representation of a cross sectional view of a discrete diode 1 is mounted on a carrier 2. The diode 1 has a diode contact 5 and side walls 6. Transmission lines 3 approach, but do not contact, the diode 1 or diode contact 5. Wire bond 4 electrically connects the transmission line 3 to the diode contact 5 using conventional means. A high frequency signal is transmitted through the transmission line 3 and wire bond 4 to the diode 1 via the diode contact 5. It has been found that the loss due to the wire bond 4 is more significant than what was previously believed. At microwave operating frequencies, the loss has been found to be an important loss mechanism for many diode based circuits. It has been identified that the source of the loss is due to electromagnetic interaction between the wire bond 4 and the diode side walls 6. Particularly, the current carrying wire bond 4 that traverses conductive silicon at the side walls 6 induces an image current in the conductive silicon along the path of the wire bond. With specific reference to FIG. 3, the relationship of sheet resistance as a function of frequency for conductive silicon is shown. It shows that, even though highly conductive, the frequency related skin effect sheet resistance of conductive silicon is significant as compared to the overall circuit, including the transmission lines 3, the wire bond 4, the diode contact 5 and the diode 1. The effect of this loss is further exacerbated in a circuit using multiple devices that exhibit this loss mechanism. FIG. 3 further shows the relationship of skin effect sheet resistance as a function of operating frequency for films of various materials and thicknesses as compared to skin effect sheet resistance of conductive silicon having no coating. The teachings of the present invention capitalize on the principle that certain materials exhibit lower skin effect sheet resistance than conductive silicon. These materials are candidates for a side wall coating. The lower the skin effect sheet resistance of a coating, the greater the advantage realized for high frequency applications.

In order to reduce losses due to the aforementioned loss mechanism according to the teachings of the present invention, the skin effect sheet resistance of the diode side wall 6 is reduced. Specifically, a coating 7 is deposited on the side walls 6. The coating 7 has a lower skin effect related sheet resistance than that of the side walls 6. The appropriate coating 7 is chosen on the basis of conductivity, thickness, and compatibility with the processes used to create the particular semiconductor device or circuit. It is preferred that a coating 7 has a lower resistivity than the diode side wall 6 material and is able to be formed with sufficient thickness to provide low skin effect related sheet resistivity at microwave frequencies.

In a preferred embodiment for a discretely mounted diode or circuit on carrier, the preferred coating 7 is metal. Preferred metals for the coating include gold (See FIG. 3 wherein the resistivity of gold is shown as a function of frequency), silver, copper, and aluminum. These metals are desirable because they exhibit low skin effect related sheet resistivity. Gold is preferred.

Deposition of the metal coating 7 on a discretely mounted diode, is preferably carried out in conjunction with an existing metal deposition step in the fabrication process. During fabrication of the device, the samples are cleaned and a mask step is used to define the areas to be metalized. Specifically, the side walls 6 of a mesa type diode structure are the areas to be metalized. Metal deposition may be carried out by either evaporation or sputtering. After deposition, excess metal is removed. Rapid thermal annealing may be used thereafter to aid adhesion of the deposited metal. Thereafter, the device is cleaned.

With specific reference to FIG. 2 of the drawings, a representation of a cross sectional view of a preferred embodiment of a Heterolithic Microwave Integrated Circuit (HMIC) PIN diode 11 is shown. The HMIC PIN diode circuit comprises transmission lines 14, electrically connected to airbridge 15, which in turn is electrically connected to the diode 11. The diode 11 is manufactured according to the HMIC process as disclosed in U.S. Pat. No. 5,268,310 mentioned and specifically incorporated by reference hereinabove. The diode 11 has a mesa structure 12 with side walls 13 and is embedded in a glass medium 10 according to the HMIC process. The side walls 13 of the diode 11 according to the HMIC process are of highly doped N-type conductivity. A coating 16 is formed on the N-type doped side walls 13. The coating 16 may be made of any material having a sufficiently low resistivity as compared to the resistivity of the material beneath the coating 16. Metals and silicides are a logical choice of material due to their low resistivity and compatibility with current semiconductor fabrication processes. For high frequency applications, the coating material preferably has a sufficient thickness as compared to the skin depth since 95% of the current is confined to the first three skin depths. It is preferred for the coating material to have a thickness of at least two skin depths. A thickness less than two skin depths is less preferred, but may be dictated by other processing concerns and/or film resistivity properties. A preferred coating 16 for reducing the skin effect related sheet resistivity for an HMIC PIN diode comprises cobalt disilicide. Cobalt disilicide is well suited for the coating 16 because it offers low resistivity and low contact resistance. Formation of a cobalt disilicide coating is also compatible with the known HMIC fabrication process. It is further preferred that the thickness of cobalt disilicide on a diode 11 made according to the HMIC process be on the order of approximately two skin depths. Two skin depths at 10 GHz is approximately 1 to 2 microns of cobalt disilicide and has a film resistivity of approximately 20 microohms-cm.

Figure 4:
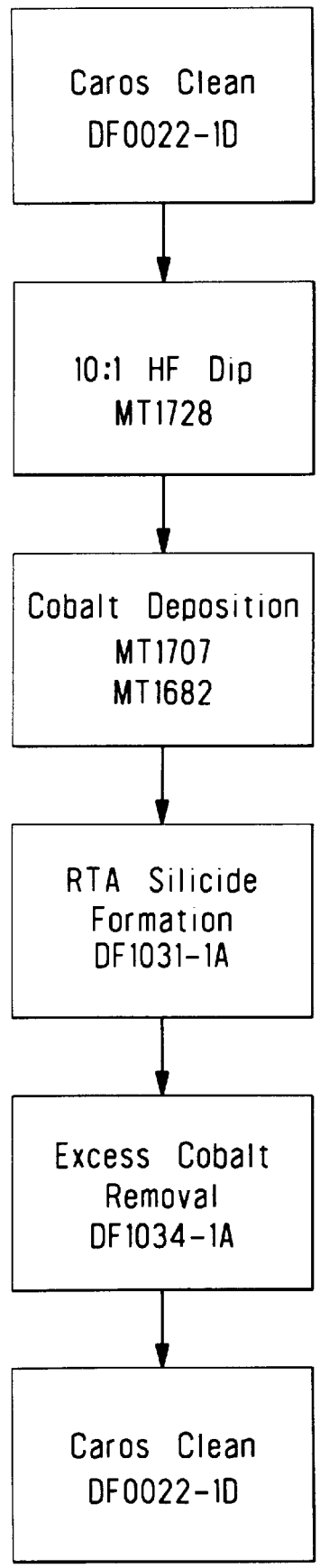
FIG. 4 is a flow chart representing the steps in a process to form a cobalt disilicide coating on side walls of a heterolithic microwave integrated circuit.
Figure 5:
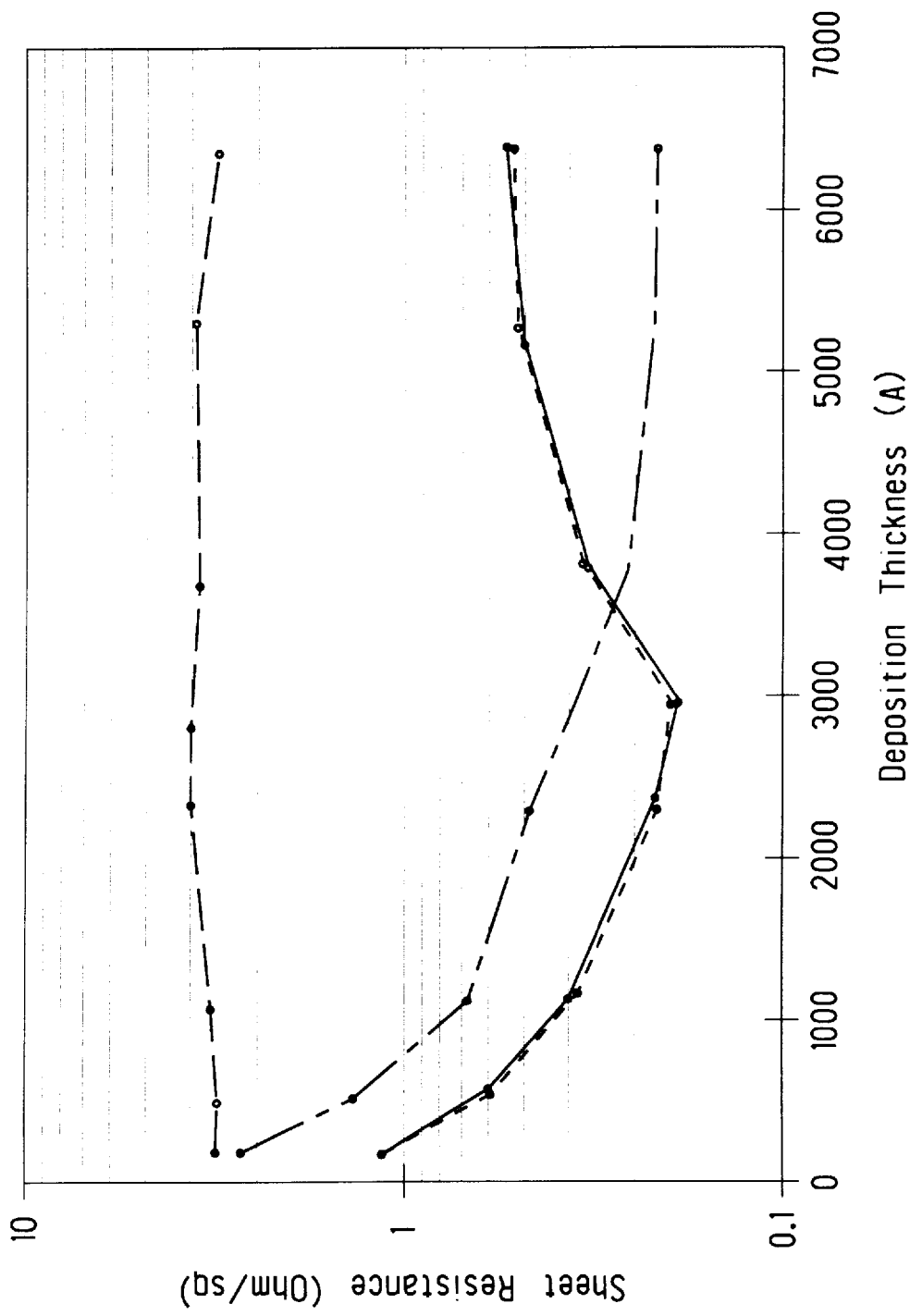
FIG. 5 is a graphical representation showing sheet resistance versus deposition thickness for Cobalt deposited on Silicon.

The process according to the teachings of the present invention to form the cobalt disilicide coating 16 on an HMIC PIN diode offers processing advantages such as low temperature processing, compatibility with conventional and relatively simple deposition equipment, and compatibility with the published HMIC process. With specific reference to FIG. 4 of the drawings, a flow chart represents the steps to form the cobalt disilicide coating on the diode 11 that is manufactured according to the HMIC process. After the mesa-type diode 11 is fabricated and prior to embedding the device in the glass medium 10, wafers bearing the devices are cleaned using a conventional Caros Clean. A silicon dioxide and/or silicon nitride mask is applied to the device to define the areas that are to receive the cobalt film, specifically the side walls 13 of the diode 11. The wafers are dipped in a dilute hydrofluoric acid having a volume ratio of ten parts deionized water to 1 part hydrofluoric acid. The wafers are immersed in the acid solution for approximately 10 seconds, spin/rinsed and dried. An electron beam evaporation system is used to deposit a 2500 Angstrom film of cobalt on the wafer without heating using a CHA MARK 50 Evaporator or equivalent. With reference to FIG. 5 of the drawings, there is shown a graph showing sheet resistance as a function of deposited film thickness of cobalt. As can be seen from the graph, there is a minimum in sheet resistivity at a 2500 Angstrom deposition thickness. A rapid thermal anneal in an inert and nonreactive atmosphere, preferably argon, provides interaction between the deposited cobalt and the underlying silicon to form the cobalt disilicide coating 16 on the side walls 13. The rapid thermal anneal is performed using an AG Associates Heat pulse 2101 system or equivalent with bottled argon gas 99.999% purity at 300 psi. The preferred rapid thermal anneal process is as follows: ramp the temperature at a rate of 30° C. per second to 900° C. in argon gas. Maintain the 900° C. for 120 seconds then allow to cool in argon. Vent the system with nitrogen. The resulting thickness of the cobalt disilicide coating 16 is approximately 1–2 micrometers. Excess cobalt is removed using a etch process with a 5:3:1:1 ratio by volume of Acetic acid:Nitric acid:Sulphuric acid:Phosphoric acid. Thereafter, the wafers are cleaned with a conventional Caros clean. For the HMIC process, the devices or circuits are then embedded in glass and polished as is taught in the HMIC process. Advantageously, formation of the coating according to the teachings of the present invention uses a process that is self aligned and does not require an extra mask step.

Figure 6:
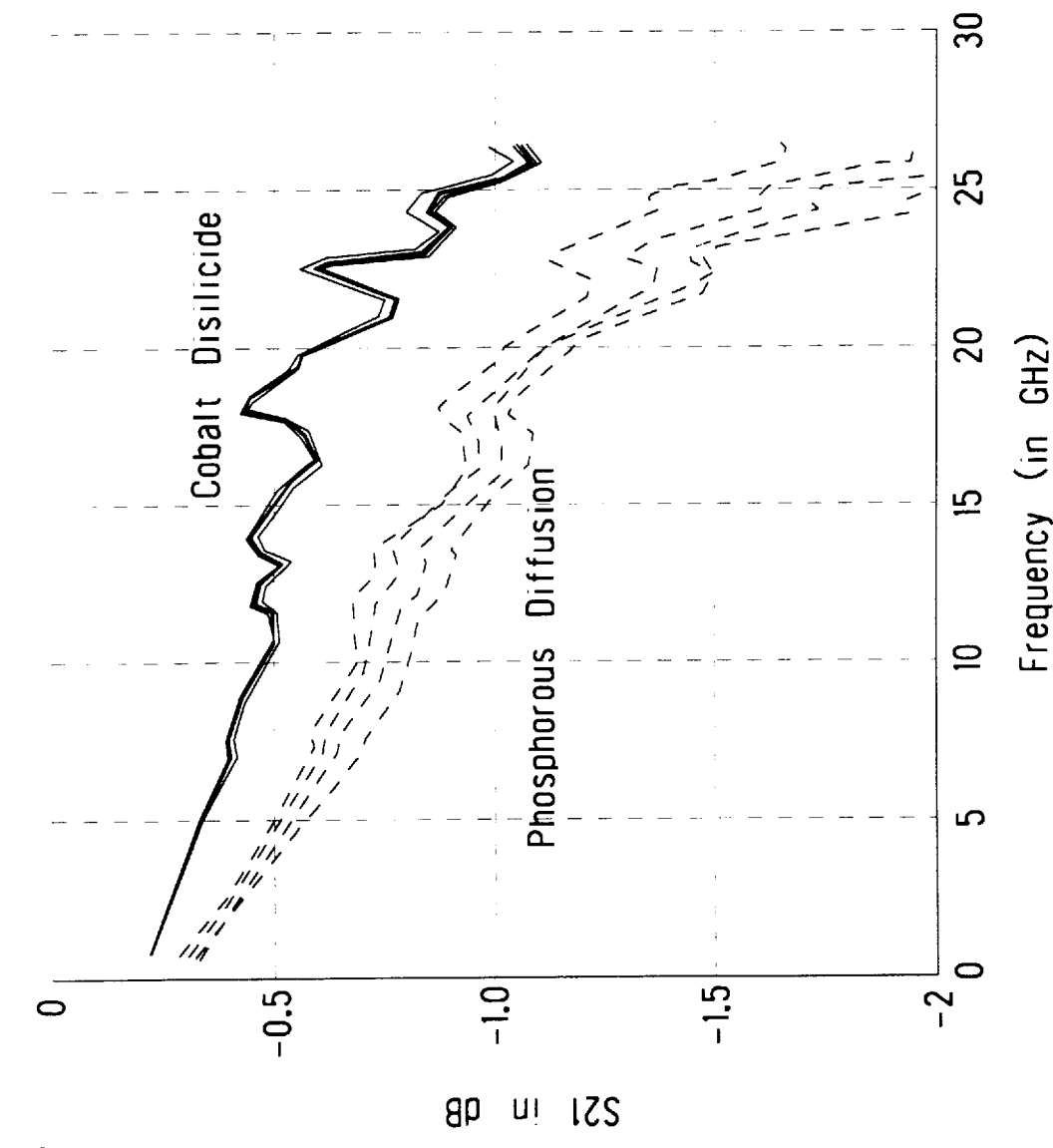
FIG. 6 is a graphical representation showing the improved results of devices according to the teachings of the present invention as compared to the known solution to the problem of high frequency losses of phosphorous diffusion on a PIN diode mesa side wall.

With specific reference to FIG. 6 of the drawings, a graph representing the insertion loss as a function of frequency is shown for four switches using HMIC PIN diodes with phosphorus diffusion at the side walls and no coating as compared to approximately ten switches using HMIC PIN diodes having a cobalt disilicide coating according to the teachings of the present invention. As is apparent, not only is the overall loss for the circuit improved, but the uniformity and repeatability is also improved.

Other advantages of the invention are apparent from the detailed description by way of example, and from the accompanying drawings, and from the spirit and scope of the appended claims.

We claim:

1. A process for fabricating a semiconductor device, the device being subject to an induced current, the process comprising the steps of:

fabricating the device and forming a coating along a path of the induced current having a skin effect sheet resistivity less than the skin effect sheet resistivity of the device material beneath the coating.

2. The process as recited in claim 1 wherein said coating has a thickness of at least one skin depth.

3. The process as recited in claim 2 wherein the step of forming a coating further comprises the step of:

depositing a metal on the device.

4. The process as recited in claim 3 wherein said metal is selected from the group consisting of gold, silver, copper, and aluminum.

5. The process as recited in claim 4 and further comprising the step of annealing the device.

6. The process as recited in claim 2 wherein the step of forming a coating further comprises the step of:

depositing a silicide on the device.

7. The process as recited in claim 6 wherein the thick film resistivity of said silicide has a resistivity approximately equivalent to the silicide thin film resistivity.

8. The process as recited in claim 6 wherein said silicide is selected from the group consisting of cobalt disilicide, titanium disilicide, and platinum silicide.

9. The process as recited in claim 6 wherein said silicide is cobalt disilicide.

10. The process as recited in claim 2 wherein the step of forming a coating further comprises the steps of:

depositing a metal on the device, annealing the device to form said coating on the device, said coating being a thick film of silicide, and removing excess metal.

11. The process as recited in claim 10 wherein said thick film of silicide has a resistivity approximately equivalent to the silicide thin film resistivity.

12. The process as recited in claim 10 wherein said metal is selected from the group consisting of cobalt, titanium and platinum.

13. The process as recited in claim 10 wherein said metal is cobalt.

14. The process as recited in claim 13 wherein said deposited film of cobalt has a thickness in a range of about 2000 to 5000 Angstroms.

15. The process as recited in claim 13 wherein said deposited film of cobalt has a thickness of approximately 2500 Angstroms.

16. The process as recited in claim 14 wherein said step of annealing said device further comprises an anneal cycle of two minutes at 900 degrees Celsius.

* * * * *